United States Patent
Lin et al.

(10) Patent No.: US 9,991,138 B2
(45) Date of Patent: Jun. 5, 2018

(54) ETCHING METHOD AND ETCHING APPARATUS

(71) Applicants: Tokyo Electron Limited, Tokyo (JP); CENTRAL GLASS CO., LTD., Yamaguchi (JP)

(72) Inventors: Jun Lin, Yamanashi (JP); Koji Takeya, Yamanashi (JP); Mitsuhiro Tachibana, Yamanashi (JP); Akifumi Yao, Yamaguchi (JP); Kunihiro Yamauchi, Yamaguchi (JP); Tatsuo Miyazaki, Tokyo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days. days.

(21) Appl. No.: 15/219,096

(22) Filed: Jul. 25, 2016

(65) Prior Publication Data
US 2017/0032990 A1    Feb. 2, 2017

(30) Foreign Application Priority Data
Jul. 27, 2015   (JP) .................. 2015-147846

(51) Int. Cl.
| | |
|---|---|
| *H01L 21/67* | (2006.01) |
| *H01L 21/3213* | (2006.01) |
| *H01L 21/311* | (2006.01) |
| *H01L 21/3065* | (2006.01) |
| *H05K 3/02* | (2006.01) |
| *H01L 23/532* | (2006.01) |

(52) U.S. Cl.
CPC .... *H01L 21/67069* (2013.01); *H01L 21/3065* (2013.01); *H01L 21/31116* (2013.01); *H01L 21/31138* (2013.01); *H01L 21/32135* (2013.01); *H01L 21/32136* (2013.01); *H05K 3/02* (2013.01); *H01L 21/32138* (2013.01); *H01L 23/53209* (2013.01); *H01L 2924/01027* (2013.01); *H05K 2203/0315* (2013.01)

(58) Field of Classification Search
None
See application file for complete search history.

(56) References Cited

U.S. PATENT DOCUMENTS

| | | | |
|---|---|---|---|
| 4,865,916 A * | 9/1989 | Yamaura | G11B 5/00 428/336 |
| 5,094,701 A | 3/1992 | Norman et al. | |
| 2015/0017810 A1 | 1/2015 | Guha | |
| 2015/0099369 A1* | 4/2015 | Deshmukh | H01L 21/32135 438/720 |

FOREIGN PATENT DOCUMENTS

| | | |
|---|---|---|
| JP | 2519625 | 7/1996 |
| JP | 2015-012243 | 1/2015 |
| JP | 2015-019065 | 1/2015 |
| KR | 10-2006-0042203 A | 5/2006 |
| KR | 10-2014-0141531 A | 12/2014 |

* cited by examiner

*Primary Examiner* — Jiong-Ping Lu

(57) ABSTRACT

An etching method includes a step of etching a cobalt film formed on a surface of a target object by supplying an etching gas containing β-diketone and an oxidizing gas for oxidizing the cobalt film to the target object. The supply of the etching gas and the oxidizing gas is carried out such that a flow rate ratio of the oxidizing gas to the etching gas is ranging from 0.5% to 50% while heating the target object to a temperature lower than or equal to 250° C.

6 Claims, 25 Drawing Sheets

ETCHING METHOD AND ETCHING APPARATUS

CROSS-REFERENCE TO RELATED APPLICATION

This application claims priority to Japanese Patent Application No. 2015-147846 filed on Jul. 27, 2015, the entire contents of which are incorporated herein by reference.

FIELD OF THE INVENTION

The disclosure relates to an etching method and an etching apparatus for a cobalt film.

BACKGROUND OF THE INVENTION

A cobalt silicide ($CoSi_2$) layer may be formed by depositing a cobalt (Co) film on a silicon (Si) film as a wiring of a semiconductor device and heating the Co film. After the $CoSi_2$ layer is formed, a semiconductor wafer (hereinafter, referred to as "wafer") that is a substrate on which the $CoSi_2$ layer is formed is immersed in a liquid chemical and subjected to wet etching. Accordingly, a residual Co film is completely removed.

Along with the trend toward miniaturization of semiconductor devices, it is considered to use Co as a wiring instead of Cu (copper) that has been conventionally used as a wiring. This is because when Cu is used as a wiring, a barrier film needs to be formed around a Cu wiring to prevent diffusion of metal atoms of the wiring to an insulating film around the wiring, whereas when Co is used as a wiring, the wiring itself serves as a barrier film, which makes it unnecessary to additionally form a barrier film.

In order to form a fine Co wiring, etching of a Co film needs to be controlled with high accuracy. Specifically, it is considered to etch the Co film such that variation of an etching amount in a surface of a wafer becomes 1 nm or less; to control roughness on a surface of the etched Co film; and to selectively etch the Co film. Since the wet etching is not suitable for controlling the etching with high accuracy, it is considered to etch the Co film by using a gas.

For example, Japanese Patent Application Publication No. 2015-12243 (paragraphs 0030 to 0035) discloses that a Co film, on a substrate heated to 200° C. to 400° C., is etched by simultaneously supplying $O_2$ gas and a hexafluoroacetylacetonate (Hfac) gas, β-diketone gas, such that a flow rate ratio of the $O_2$ gas to the Hfac gas becomes 1% or less. The $O_2$ gas serves as an oxidizing gas for oxidizing the Co film. The Hfac gas serves an etching gas for generating a complex having a comparatively low vapor pressure by reaction with the oxidized Co film and then removing an oxide of the Co film. Japanese Patent Application Publication No. 2015-19065 (paragraphs 0035 and 0036) discloses that a Co film is etched by using an Hfac gas that may be added with $O_2$ gas. Further, Japanese Patent No. 2519625 (paragraphs 0035 and 0036) discloses that a metal contaminant such as copper or the like on a surface of a substrate is removed by reaction with β-diketone in an oxidizing atmosphere.

It has been confirmed by the present inventors that when the Co film formed on the surface of the substrate is etched by supplying both the $O_2$ gas and the Hfac gas to the substrate, the Hfac gas is decomposed even at a comparatively low temperature due to the catalytic effect of Co and oxidized Co and the action of the $O_2$ gas, and a film mainly containing carbon (hereinafter, referred to as "carbon film") remained on the processed substrate. Japanese Patent Application Publication No. 2015-12243 discloses that the $O_2$ gas and the Hfac gas are simultaneously supplied to the wafer while heating the substrate to a comparatively high temperature ranging from 300° C. to 400° C. In that case, the carbon film is formed; however, Japanese Patent Application Publication No. 2015-12243 does not pay attention to the formation of the carbon film by the Hfac gas, and cannot solve the problem of the formation of the carbon film. In addition, a solution to the above problem is not disclosed in Japanese Patent Application Publication No. 2015-19065 and Japanese Patent No. 2519625.

SUMMARY OF THE INVENTION

In accordance with a first aspect of the present invention, there is provided an etching method including: etching a cobalt film formed on a surface of a target object by supplying an etching gas containing β-diketone and an oxidizing gas for oxidizing the cobalt film to the target object such that a flow rate ratio of the oxidizing gas to the etching gas ranges from 0.5% to 50%, while heating the target object to a temperature lower than or equal to 250° C.

In accordance with a second aspect of the present invention, there is provided an etching method including: supplying a target object with an oxidizing gas to oxidize a cobalt film formed on a surface of the target object; and etching the oxidized cobalt film by supplying an etching gas containing β-diketone and a decomposition suppressing gas for suppressing decomposition of the etching gas.

In accordance with a third aspect of the present invention, there is provided an etching apparatus including: a mounting table provided in a processing chamber and configured to mount a target object having a cobalt film formed on a surface thereof; a heating unit configured to heat the target object mounted on the mounting table; a supply unit configured to supply the target object with an etching gas containing β-diketone and an oxidizing gas for oxidizing the cobalt film; and a control unit configured to output a control signal for supplying the target object with the oxidizing gas and the etching gas such that a flow rate ratio of the oxidizing gas to the etching gas ranges from 0.5% to 50%, while heating the target object to a temperature lower than or equal to 250° C. to thereby etch the cobalt film.

In accordance with a fourth aspect of the present invention, there is provided an etching apparatus including: a mounting table provided in a processing chamber and configured to mount a target object having a cobalt film formed on a surface thereof; an oxidizing gas supply unit configured to supply the target object with an oxidizing gas for oxidizing the cobalt film; an etching gas supply unit configured to supply the target object with an etching gas containing β-diketone; a decomposition suppressing gas supply unit configured to supply the target object with a decomposition suppressing gas for suppressing decomposition of the etching gas; and a control unit configured to output a control signal for executing supplying the oxidizing gas to the target object and supplying the etching gas and the decomposition suppressing gas to the target object.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

First Embodiment

Figure 1:
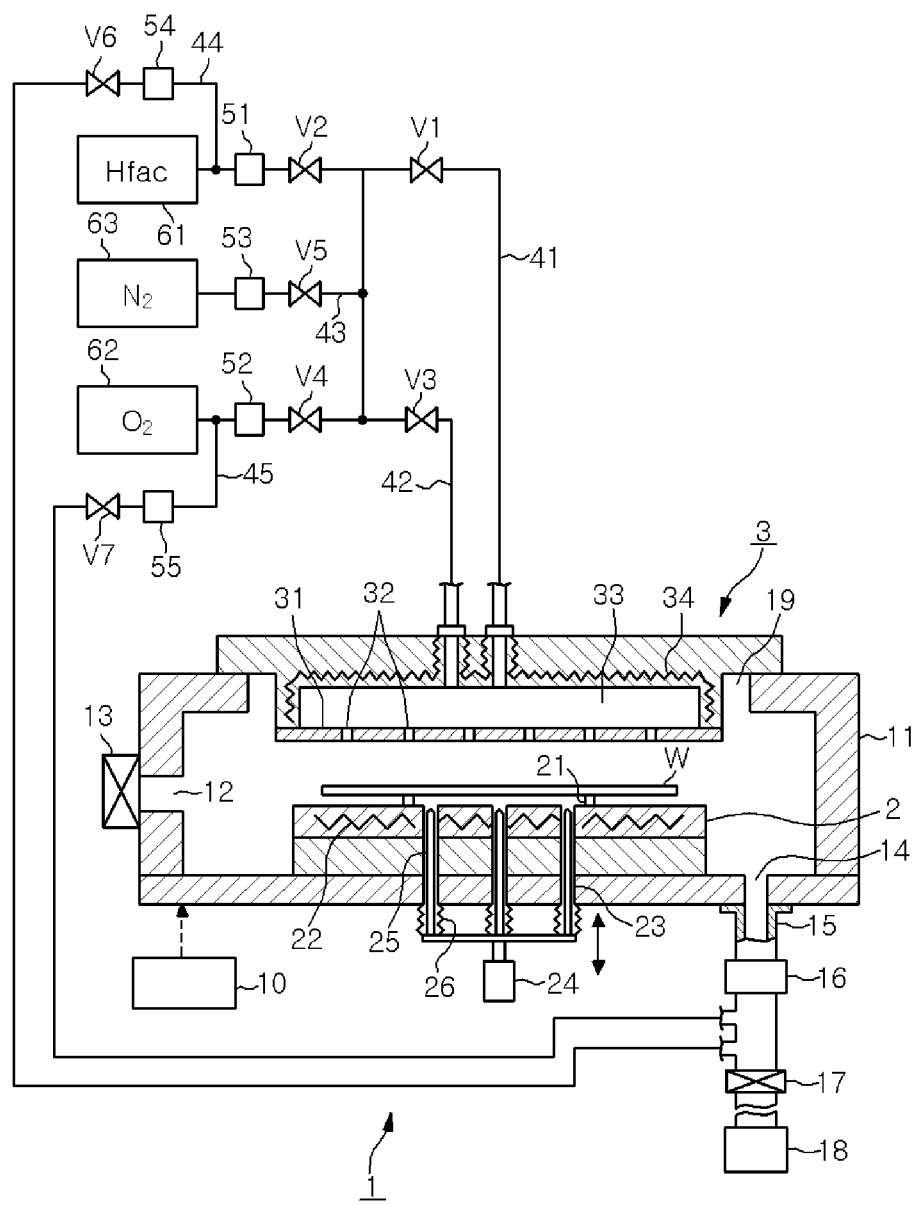
FIGS. 1 to 3 are vertical cross sectional side views of an etching apparatus according to a first embodiment.

An etching apparatus 1 for performing an etching method according to a first embodiment will be described with reference to FIG. 1. A cobalt (Co) film for forming a wiring of a semiconductor device is formed on a surface of a wafer W as a target object to be processed by the etching apparatus 1. The etching apparatus 1 includes a processing chamber 1 that is a vacuum chamber having an approximately circular cross sectional shape. A reference numeral 12 in the drawing indicates a loading/unloading port that is opened at a side surface of the processing chamber 11 to load and unload the wafer W. The loading/unloading port 12 is opened/closed by a gate valve 13. A heater (not shown) for heating an inner surface of the processing chamber 11 to a predetermined temperature is provided at the processing chamber 11.

A cylindrical stage 2, on which the wafer W is mounted, is provided in the processing chamber 11. Reference numeral 21 in the drawing indicates supporting pins for supporting the wafer W mounted on the stage 2. A plurality of supporting pins 21 is provided on a top surface of the stage 2 to support the wafer W separated from the top surface of the stage 2 by a distance of, e.g., 0.3 mm. A heater 22 serving as a heating unit is provided in the stage 2 to heat the wafer W mounted on the stage 2 to a preset temperature.

Reference numeral 23 in the drawing indicates through-holes penetrating through the stage 2 and a bottom surface of the processing chamber 11. Elevating pins 25 configured to project above and retract below the top surface of the stage by an elevation unit 24 penetrate through the through-holes 23 to transfer the wafer W. Reference numeral 26 indicates a bellows for ensuring airtightness in the processing chamber 11 while covering the bottom sides of the elevating pins 25. Reference numeral 14 in the drawing indicates a gas exhaust port that is opened at the bottom surface of the processing chamber 11. One end of a gas exhaust line 15 is connected to the gas exhaust port 14. The other end of the gas exhaust line 15 is connected to a vacuum pump 18 serving as an evacuation mechanism via a pressure control valve 16 and an opening/closing valve 17 in that order.

A circular gas supply unit 3 is provided to block an opening 19 formed in the top surface of the processing chamber 11. Reference numeral 31 in the drawing indicates a diffusion plate included in the gas supply unit 3. The diffusion plate 31 is disposed to face the wafer W mounted on the stage 2. Reference numeral 32 in the drawing indicates a gas supply hole penetrating through the diffusion plate 31 in a thickness direction thereof. The diffusion plate 31 is configured as a perforated plate having a plurality of gas supply holes 32 arranged in a matrix pattern. A dispersion space 33 for dispersing gases to be supplied to the wafer W in the gas supply unit 3 is formed above the diffusion plate 31. Reference numeral 34 in the drawing indicates a heater for heating the gas supply unit 3.

Reference numerals 41 and 42 in the drawing indicate gas supply lines. Downstream ends of the gas supply lines 41 and 42 are opened to the dispersion space 33. An upstream end of the gas supply line 41 is connected to a hexafluoro-acetylacetonate (Hfac) gas supply source 61 via valves V1 and V2 and a flow rate controller 51 in that order. Here, the Hfac is one kind of β-diketone. An upstream end of the gas supply line 42 is connected to an $O_2$ gas supply source 62 via valves V3 and V4 and a flow rate controller 52 in that order.

Reference numeral 63 in the drawing indicates an $N_2$ gas supply source. The $N_2$ gas supply source 63 is connected to an upstream end of a gas supply line 43. A flow rate controller 53 and a valve V5 are installed in the gas supply line 43 in that order toward the downstream side. The gas supply line 43 is branched at a downstream end thereof into two lines respectively connected to a position between the valve V1 and V2 in the gas supply line 41 and to a position between the valves V3 and V4 in the gas supply line 42. The $O_2$ gas serves as an oxidizing gas for oxidizing a Co film. The Hfac gas serves as an etching gas for etching the oxidized Co film. The $N_2$ gas serves as a dilution gas for diluting the Hfac gas and the $O_2$ gas.

An upstream end of a bypass line 44 is connected to a position between the Hfac gas supply source 61 and the flow rate controller 51 in the gas supply line 41. A downstream end of the bypass line 44 is connected to a position between the pressure control valve 16 and the opening/closing valve 17 in the gas exhaust line 15 via a flow rate controller 54 and a valve V6 in that order. An upstream end of a bypass line 45 is connected to a position between the $O_2$ gas supply source 62 and the flow rate controller 52 in the gas supply line 42. A downstream end of the bypass line 45 is connected to a position between the pressure control valve 16 and the opening/closing valve 17 in the gas exhaust line 15 via a flow rate controller 55 and a valve V7. The bypass lines 44 and 45 are used for stabilizing flow rates of the Hfac gas and the $O_2$ gas supplied to the processing chamber 11 by allowing the Hfac gas and the $O_2$ gas to flow toward the gas exhaust line 15 when the Hfac gas and the $O_2$ gas are not supplied to the processing chamber 11 during an etching process to be described later.

The etching apparatus 1 further includes a control unit 10. The control unit 10 is, e.g., a computer, and has a program, a memory, and a CPU. The program has a group of steps for executing a series of operations to be described later. The temperature of the wafer W, the opening/closing of the valves V, the flow rates of the gases, the pressure in the processing chamber 11 and the like are controlled depending on the program. The program is stored in a computer storage medium, e.g., a compact disk, a hard disk, a magneto-optical disk, a memory card, or the like, and installed in the control unit 10.

The etching apparatus 1 simultaneously supplies $O_2$ gas as an oxidizing gas and Hfac gas as an etching gas to the Co film on the surface of the wafer W. The Co film to which the Hfac gas and the $O_2$ gas are supplied is etched in the following manner. First, as can be seen from the following reaction formula (1), the surface of the Co film is oxidized. $CoO_x$ is an oxide of cobalt. As can be seen from the following reaction formula (2), $CoO_x$ reacts with the Hfac gas, thereby generating solid Co(Hfac)$_2$ that is a complex. The solid Co(Hfac)$_2$ has a comparatively low vapor pressure and is sublimated by heat of the wafer W as can be seen from the following reaction formula (3) to be removed from the wafer W. The Co film is etched by the progress of the reactions described in reaction formulas (1) to (3).

Co+O$_2$→CoO$_x$               Reaction formula (1)

CoO$_x$+Hfac→Co(Hfac)$_2$+H$_2$O       Reaction formula (2)

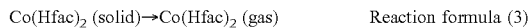
Co(Hfac)$_2$ (solid)→Co(Hfac)$_2$ (gas)   Reaction formula (3)

By executing the same reactions by using the Hfac gas and the O$_2$ gas, a metal film containing a material other than Co, e.g., a metal film containing Ni (nickel), can be etched. In the case of etching the metal film containing a material other than Co, a thermal decomposition temperature of the Hfac gas supplied to the wafer W is slightly higher than 350° C. Therefore, in order to effectively execute the reactions in the reaction formulas (1) to (3) in the case of etching the Co film, it is effective to process the wafer W at a comparatively high temperature within a temperature range lower than the thermal decomposition temperature. Specifically, it is effective to execute the reactions in the reaction formulas (1) to (3) while heating the wafer W to a temperature ranging from, e.g., 275° C. to 350° C.

However, as described above, the present inventors have found that when the Co film is etched by simultaneously supplying Hfac gas and O$_2$ gas to the wafer W while heating the wafer W to a temperature ranging from 275° C. to 350° C., a carbon film is formed on the surface of the wafer W after the etching process. This is because the Hfac gas is decomposed by the action of the O$_2$ gas due to the catalytic effect of Co and CoO$_x$ even when the temperature of the wafer W ranges from 275° C. to 350° C. and carbon contained in the Hfac gas is deposited. The etching apparatus 1 etches the Co film by executing the reactions in the reaction formulas (1) to (3) so that the decomposition of the Hfac gas can be suppressed.

Figure 2:
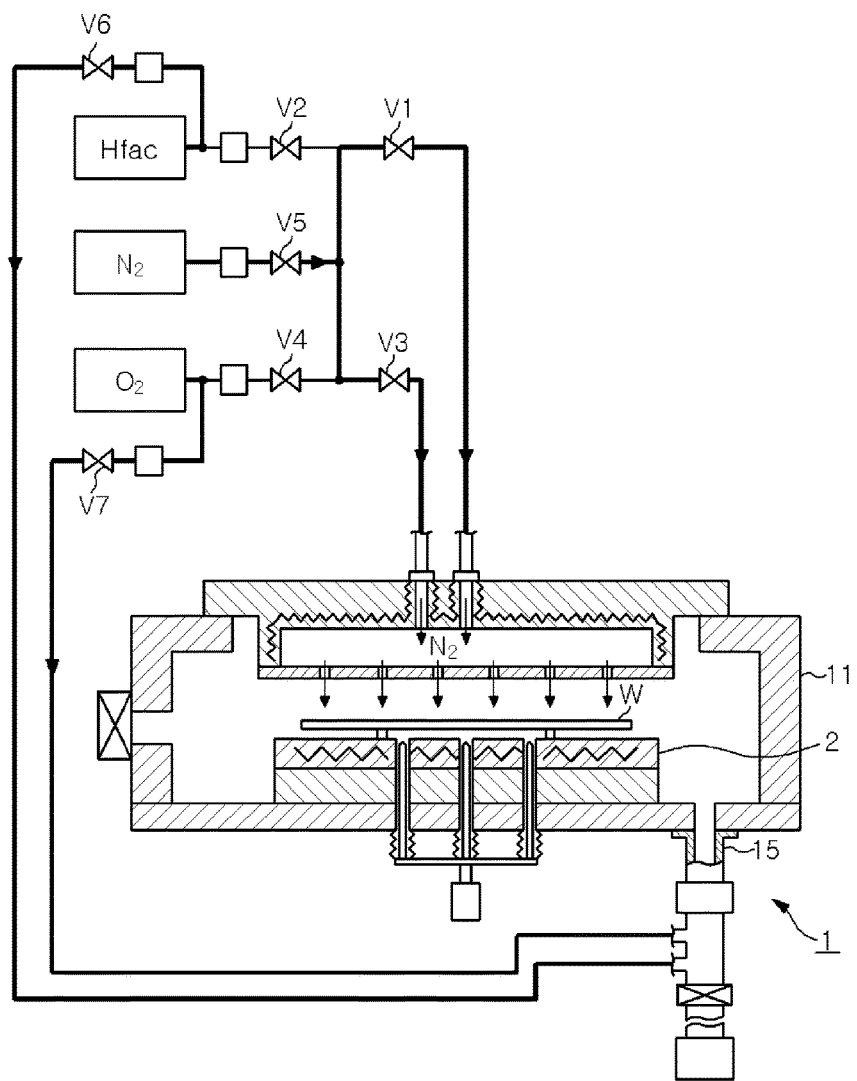
Figure 3:
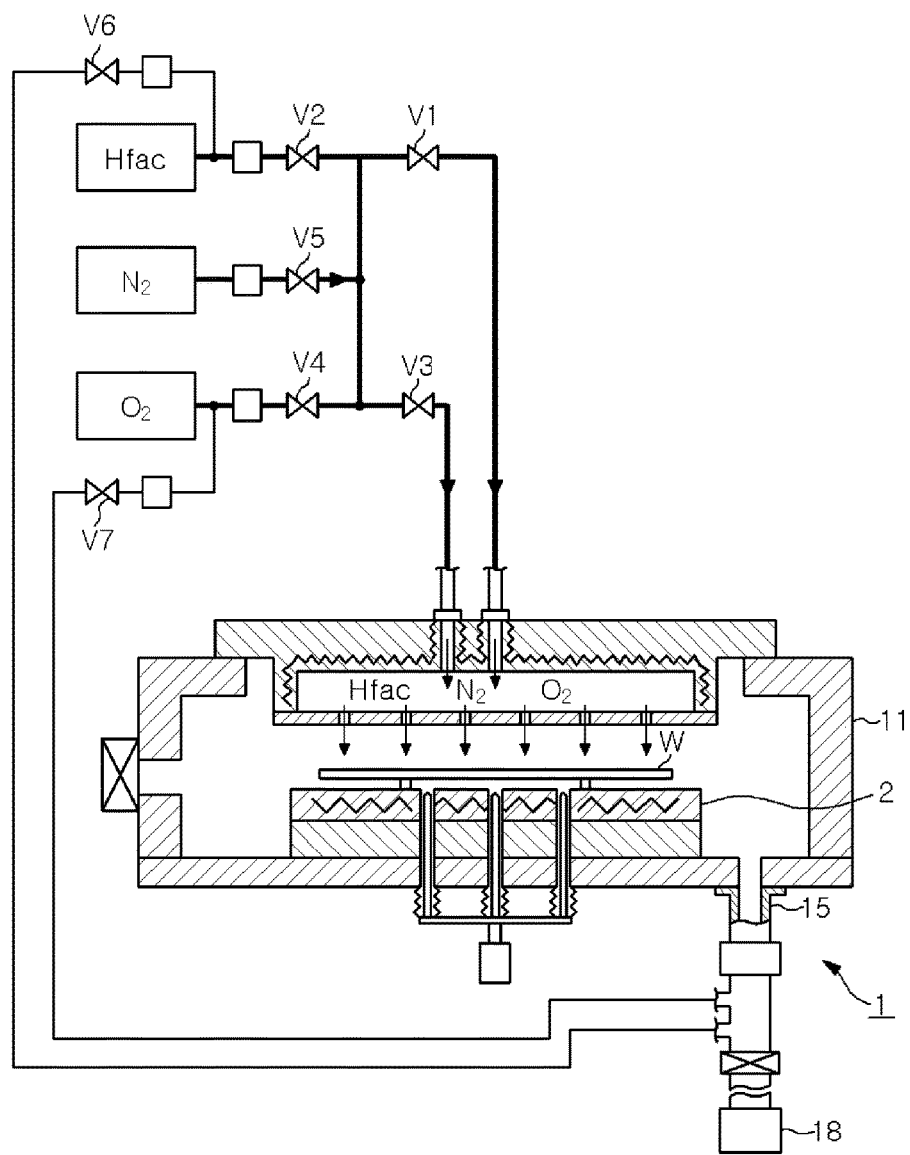

Hereinafter, an operation of the etching apparatus 1 will be described with reference to FIGS. 2 and 3. In FIGS. 2 and 3, portions in the lines where the gas flows are indicated by bold lines and portions in the lines where the gas does not flow are indicated by thin lines. First, the wafer W is mounted on the stage 2 and heated to a temperature of, e.g., 200° C. to 250° C. Then, the processing chamber 11 is exhausted to form a vacuum atmosphere in the processing chamber 11. Next, the valves V1, V3 and V5 are opened and N$_2$ gas is supplied into the processing chamber 11. At the same time, the valves V6 and V7 are opened and the Hfac gas and the O$_2$ gas are supplied into the gas exhaust line 15. FIG. 2 shows a state in which the gases are supplied.

Next, the valves V6 and V7 are closed and the valves V2 and V4 are opened. As shown in FIG. 3, the Hfac gas and the O$_2$ gas are supplied to the wafer W in the processing chamber 11. When the Hfac gas and the O$_2$ gas are supplied to the wafer W, a pressure in the processing chamber 11 is, e.g., 10 Pa to 100 Pa, and a flow rate ratio of the O$_2$ gas serving as an oxidizing gas to the Hfac gas serving as an etching gas is, e.g., 0.5% to 50%.

Due to the O$_2$ gas and the Hfac gas supplied to the wafer W, the complex is formed on the surface of the Co film as described in the reaction formulas (1) and (2) and sublimated by the heat of the wafer W as described in the reaction formula (3). As a result, the surface of the Co film is etched. Since the temperature of the wafer W is comparatively low during the etching process, the decomposition of the Hfac gas supplied to the wafer W is suppressed. Although the temperature of the wafer W is low, the flow rate ratio of the O$_2$ gas to the Hfac gas is set as described above, and the Co film is quickly etched. The present inventors have confirmed from the test that a practically sufficient etching speed can be obtained by setting the flow rates of the Hfac gas and the O$_2$ gas as described above.

When the surface of the Co film is etched by a desired amount, the valves V2 and V4 are closed and the valves V6 and V7 are opened. Accordingly, as shown in FIG. 2, the supply of the Hfac gas and the O$_2$ gas into the processing gas 11 is stopped and the Hfac gas and the O$_2$ gas remaining in the processing chamber 11 are purged by the N$_2$ gas supplied into the processing chamber 11, thereby completing the etching of the Co film.

In the processing performed by the etching apparatus 1, the temperature of the wafer W and the flow rate ratio of the Hfac gas and the O$_2$ gas supplied to the wafer W are set as described above. Accordingly, it is possible to etch the Co film without decreasing the etching speed while preventing the formation of the carbon film by suppressing the decomposition of the Hfac gas.

The oxidizing gas for oxidizing Co and generating CoO$_x$ is not limited to the O$_2$ gas. For example, NO (nitrogen monoxide) gas or O$_3$ (ozone) gas may be used instead of the O$_2$ gas. The present inventors have confirmed that a higher etching speed is obtained in the case of using the O$_3$ gas or the NO gas than in the case of using the O$_2$ gas. In the case of using the O$_3$ gas or the NO gas as the oxidizing gas, the processing is performed while setting the flow rate ratio of the oxidizing gas to the Hfac gas as described above.

Second Embodiment

Figure 4:
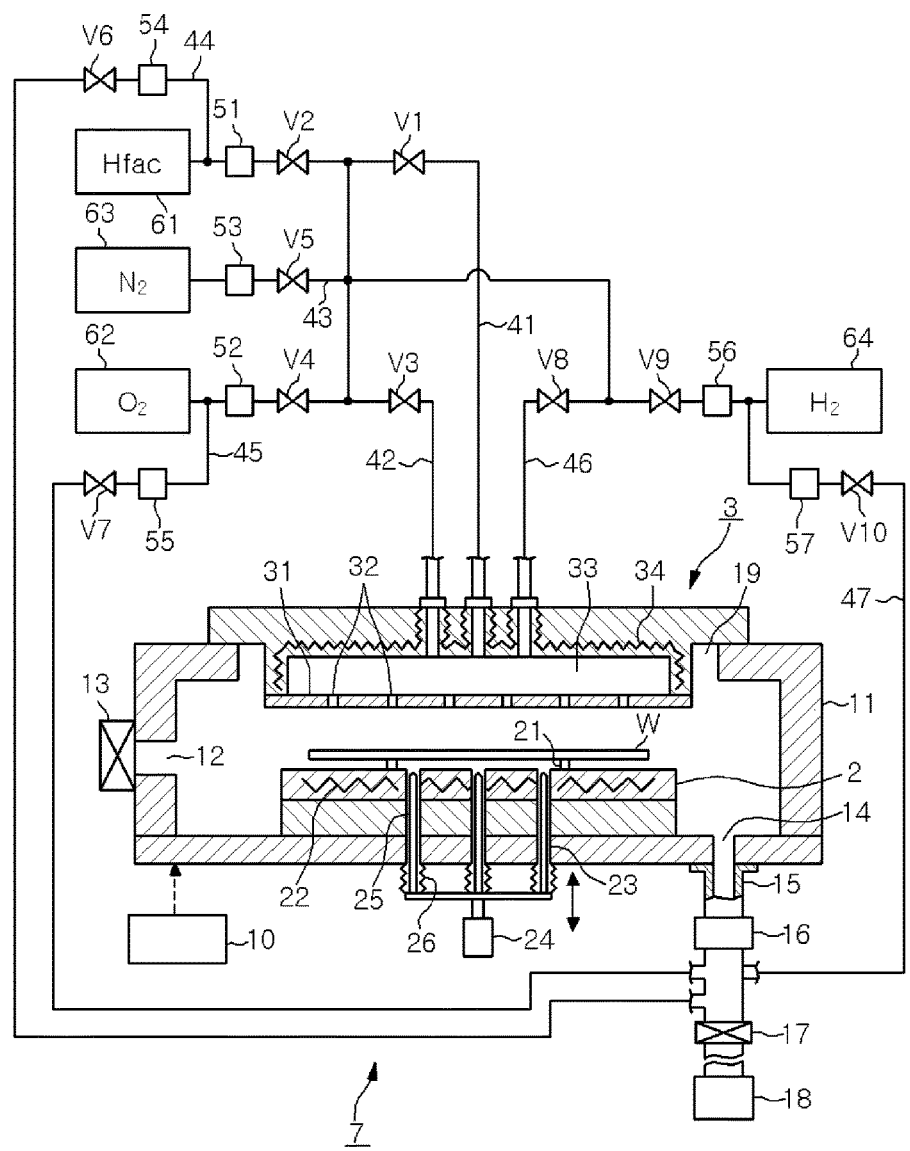
FIGS. 4 to 7 are vertical cross sectional side views of an etching apparatus according to a second embodiment.

Hereinafter, an etching apparatus 7 for performing an etching method according to a second embodiment will be described with reference to FIG. 4. Here, the difference between the etching apparatus 1 and the etching apparatus 7 will be described mainly. The etching apparatus 7 has a gas supply line 46 having a downstream end opened to the dispersion space 33 and an upstream end connected to an H$_2$ gas supply source 64 for suppressing decomposition of the Hfac gas via valves V8 and V9 and a flow rate controller 56 in that order.

An upstream end of a bypass line 47 is connected to a position between the H$_2$ gas supply source 64 and the flow rate controller 56 in the gas supply line 46. A downstream end of the bypass line 47 is connected to a position between the pressure control valve 16 and the opening/closing valve 17 in the gas exhaust line 15 via a flow rate controller 57 and a valve V10 in that order. Similar to the bypass lines 44 and 45, the bypass line 47 is used for stabilizing the flow rate of the H$_2$ gas supplied to the processing chamber 11 by allowing the H$_2$ gas to flow toward the gas exhaust line 15 when the H$_2$ gas is not supplied to the processing chamber 11. The gas supply line 43 of which upstream end is connected to the N$_2$ gas supply source 63 is branched at the downstream end to three lines. Among the three lines, two lines are connected to the gas supply lines 41 and 42 as in the case of the etching apparatus 1 and the remaining one line is connected to a position between the valves V8 and V9 in the gas supply line 46.

Figure 5:
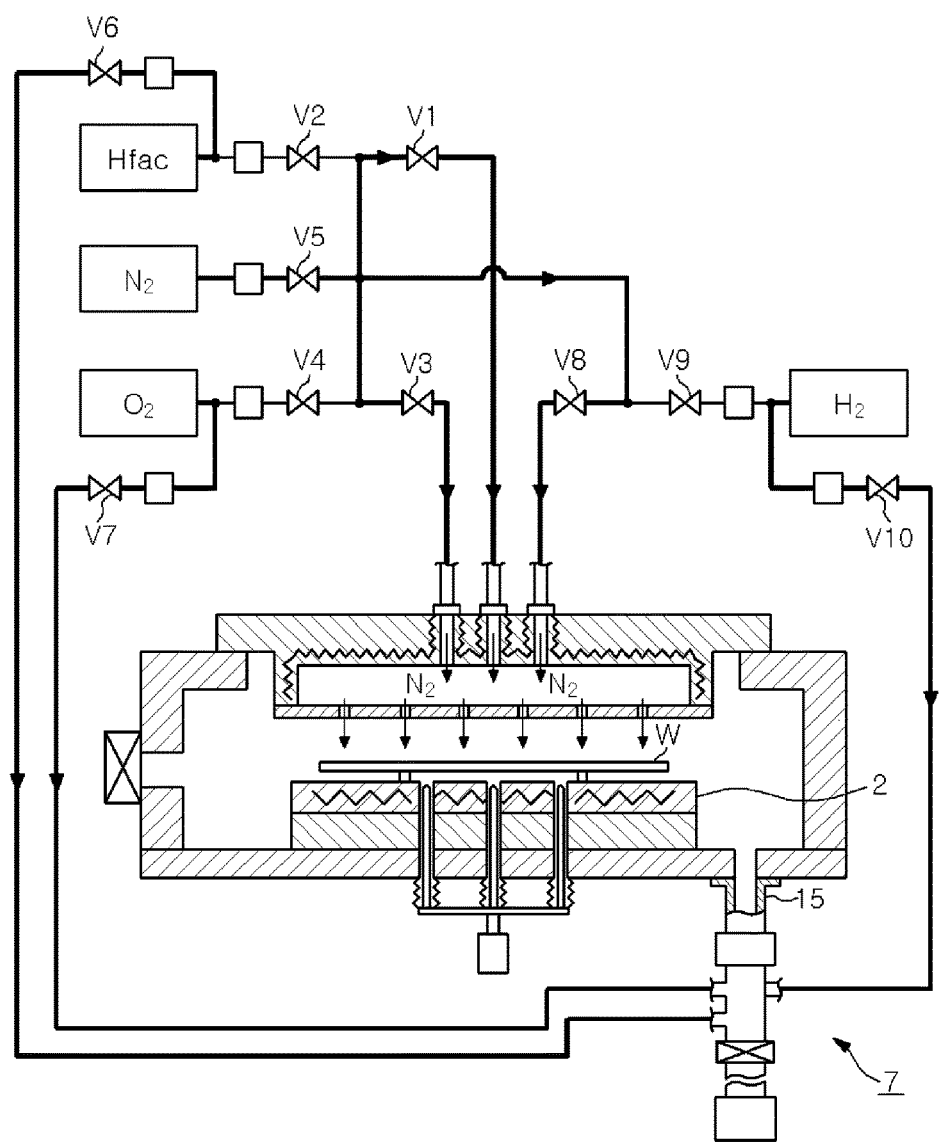
Figure 6:
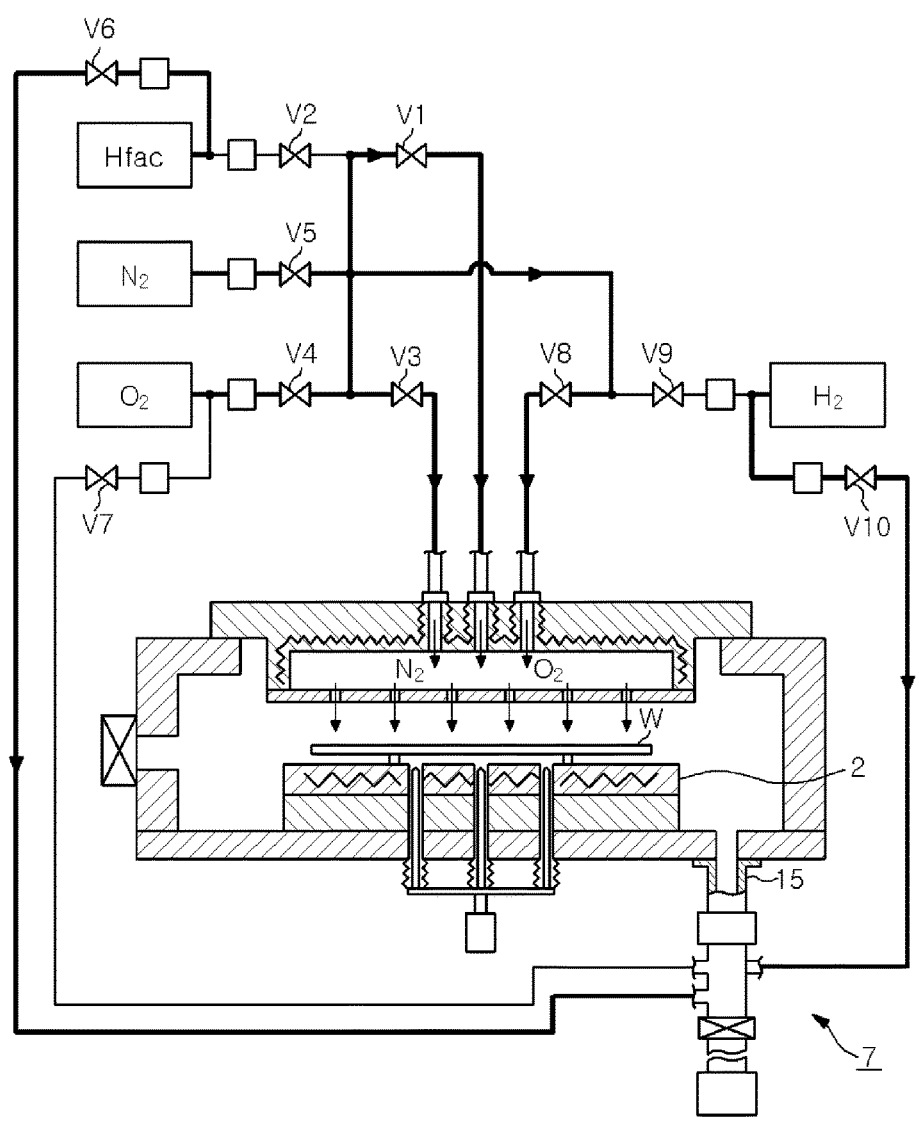
Figure 7:
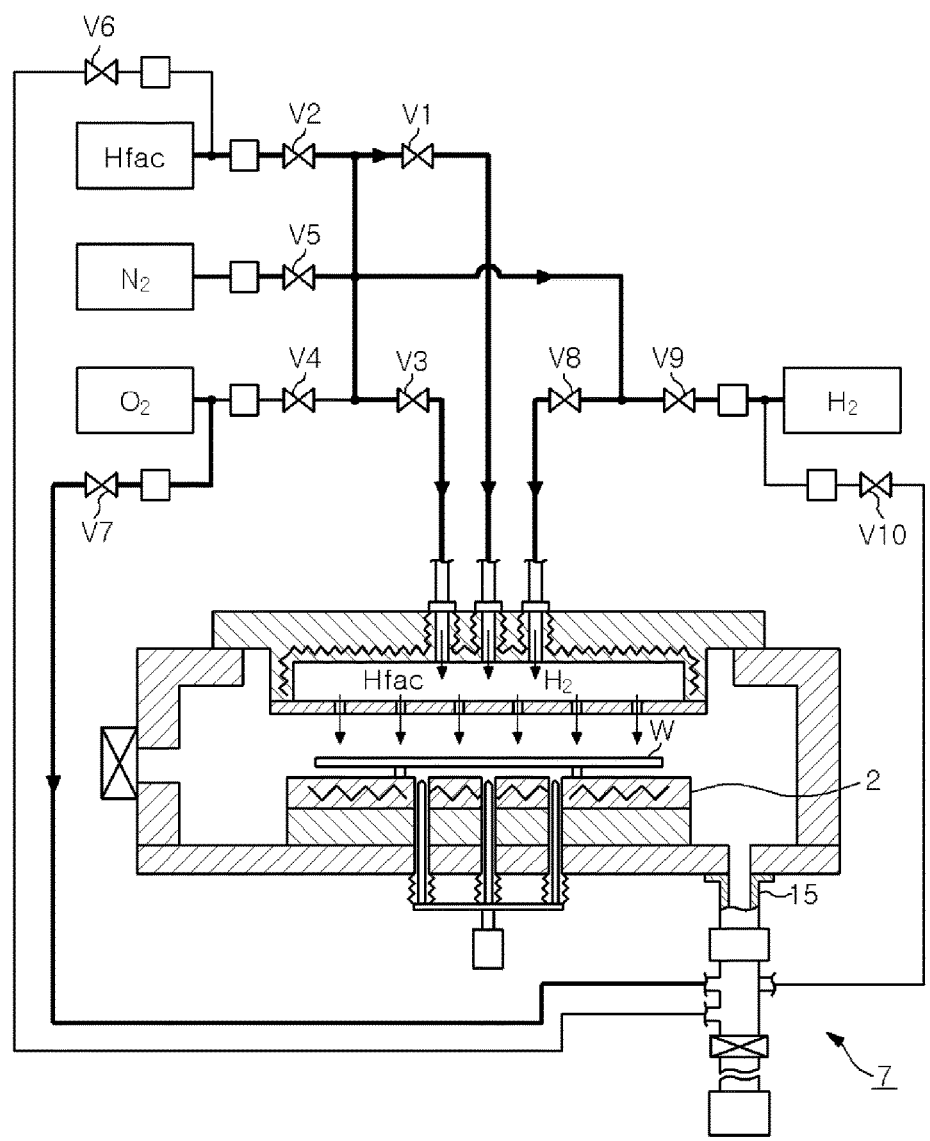
Figure 8:
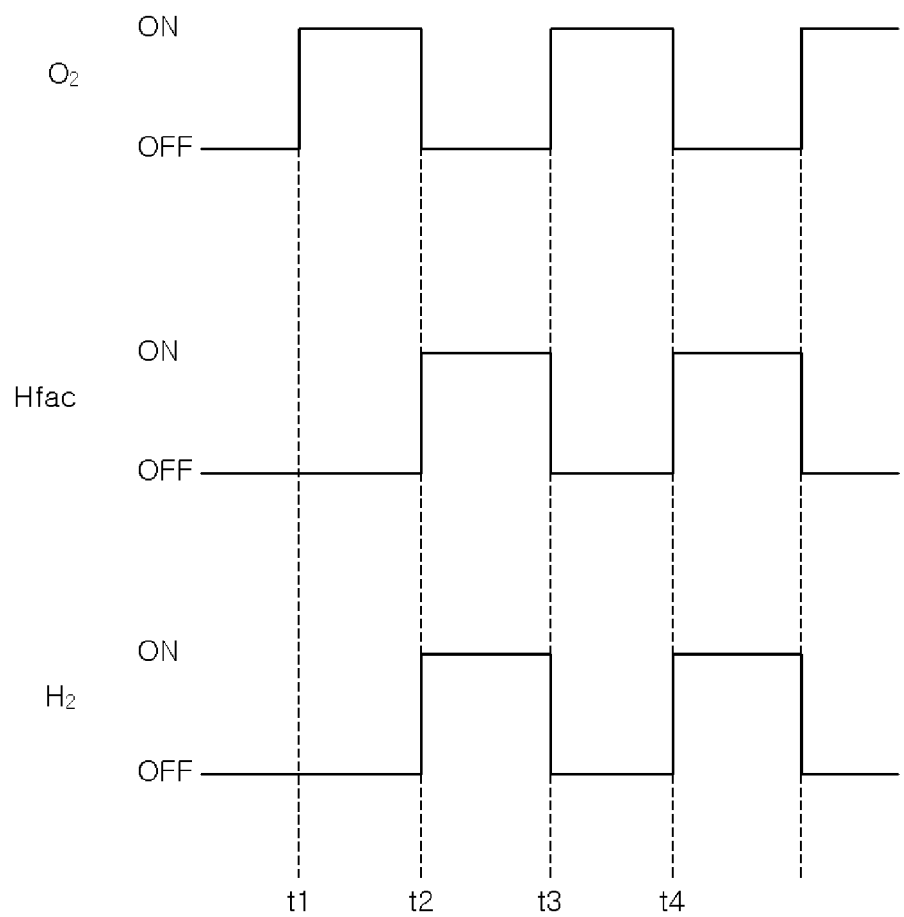
FIG. 8 is a timing chart showing a supply state and a supply stop state of gases.
Figure 9:
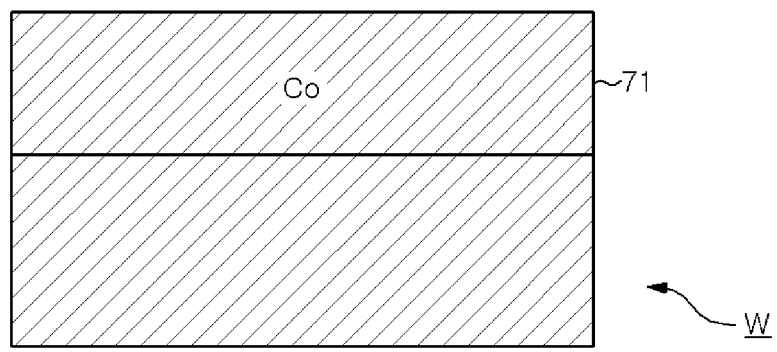
FIGS. 9 to 11 are vertical cross sectional side views of a wafer.
Figure 10:
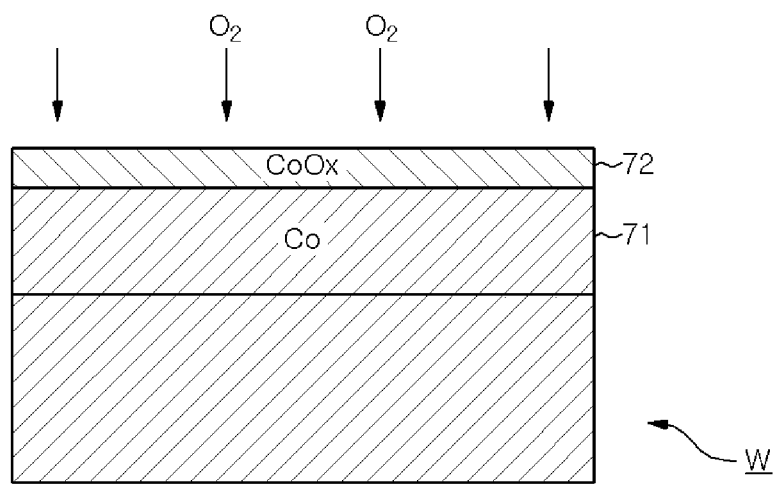
Figure 11:
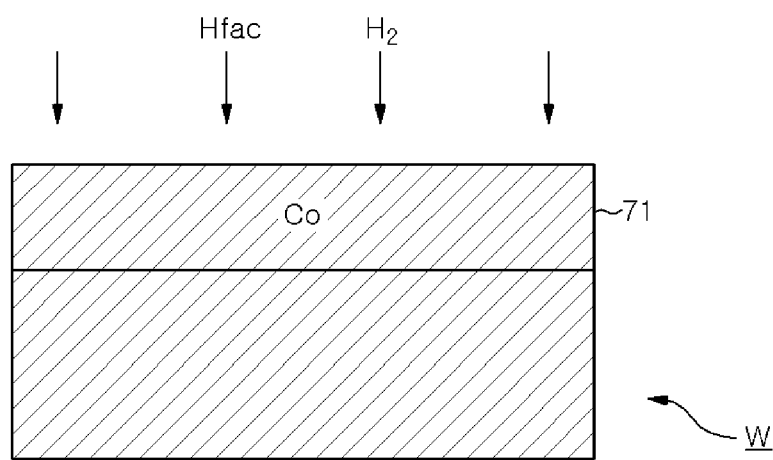

Hereinafter, an operation of the etching apparatus 7 will be described with reference to FIGS. 5 to 7. Similarly to FIGS. 2 and 3, FIGS. 5 to 7 illustrate the gas flows in the lines. FIG. 8 is a timing chart showing switching between a state in which O$_2$ gas, Hfac gas and H$_2$ gas are supplied to the wafer W (indicated as "ON" in the chart) and a state in which the gas supply is stopped (indicated as "OFF" in the drawing). FIG. 8 will be referred to appropriately. FIGS. 9 to 11 are vertical cross sectional side views of the wafer W. FIGS. 9 to 11 will be referred to appropriately. FIG. 9 shows the wafer W before the process in the etching apparatus 7. Reference numeral 71 in the drawing indicates a Co film formed on the surface of the wafer W.

First, the wafer W shown in FIG. 9 is mounted on the stage 2 and heated by the heater 22 to a temperature higher than or equal to, e.g., 250° C., and lower than the decomposition temperature of the Hfac gas which specifically ranges from, 250° C. to 350° C., for example. Then, the processing chamber 11 is exhausted to form a vacuum atmosphere in the processing chamber 11. The valves V1, V3, V5 and V8 are opened and the $N_2$ gas is supplied into the processing chamber 11. At the same time, the valves V6, V7 and V10 are opened and Hfac gas, $O_2$ gas and $H_2$ gas are supplied into the gas exhaust line 15. FIG. 5 shows a state in which the gases are supplied.

Next, the valve V7 is closed and the valve V4 is opened. In a state where the pressure in the processing chamber 11 becomes, e.g., 10 Pa to 100 Pa, $O_2$ gas is supplied into the processing chamber 11 as shown in FIG. 6 (timing t1 in the chart of FIG. 8) (step S1). Accordingly, the surface of the Co film is oxidized and a $CoO_x$ layer 72 is generated as described in the reaction formula (1) (see FIG. 10).

Then, the valves V4, V6 and V10 are closed and the valves V2, V7 and V9 are opened. In a state where the pressure in the processing chamber 11 becomes, e.g., 10 Pa to 100 Pa, Hfac gas and $H_2$ gas are supplied to the wafer W in the processing chamber 11 as shown in FIG. 7 (timing t2 in the chart of FIG. 8) (step S2). The $O_2$ gas in the processing chamber 11 is purged by the Hfac gas and the $H_2$ gas. The decomposition of the Hfac gas is suppressed by supplying the Hfac gas together with the $H_2$ gas serving as a decomposition suppressing gas in a state where the concentration of the $O_2$ gas in the processing chamber 11 is decreased due to the supply stop of the $O_2$ gas into the processing chamber 11. Thus, the formation of the carbon layer is suppressed and the formation and the sublimation of the complex described in the reaction formulas (2) and (3) occur. As a result, the $CoO_x$ layer 72 on the surface of the Co film is removed (see FIG. 11).

Thereafter, the valves V2, V7 and V9 are closed and the valves V4, V6 and V10 are opened. The supply of the Hfac gas and the $H_2$ gas into the processing chamber 11 is stopped, and the $O_2$ gas is supplied to the wafer W in the processing chamber 11 (the above step S1) (timing t3 in FIG. 8). In other words, the surface of the Co film is oxidized and the $CoO_x$ layer 72 is formed. Next, the valves V4, V6 and V10 are closed and the valves V2, V7 and V8 are opened. Accordingly, the supply of the $O_2$ gas into the processing chamber 11 is stopped, and the Hfac gas and the $H_2$ gas are supplied to the wafer W in the processing chamber 11 (the above step S2). In other words, the complex is formed and the $CoO_x$ layer 72 is removed (timing t4 in FIG. 8).

When the surface of the Co film is etched by a desired amount by repeating the steps S1 and S2 a predetermined number of times, the state where the step S2 is executed is shifted to a state where the valves V6 and V10 are opened and the valves V2 and V9 are closed to supply only the $N_2$ gas into the processing chamber 11 as shown in FIG. 5. The Hfac gas and the $H_2$ gas remaining in the processing chamber 11 are purged by the $N_2$ gas and the etching of the Co film is completed.

In the etching apparatus 7, the Hfac gas and the $H_2$ gas are supplied after the $O_2$ gas is supplied to the wafer W having the Co film thereon. Therefore, the decomposition of the Hfac gas by the action of the $O_2$ gas due to the catalytic effect of Co and $CoO_x$ is suppressed. Accordingly, the Co film can be etched while preventing the formation of the carbon film on the wafer W.

In the above example, the $H_2$ gas serving as the decomposition suppressing gas is supplied together with the Hfac gas to the wafer W. However, any gas having reducibility to the Hfac gas can suppress oxidation and decomposition of the Hfac gas and thus can be used as the decomposition suppressing gas. For example, $NH_3$ gas, $H_2S$ gas or the like may be used as the decomposition suppressing gas. The steps S1 and S2 may not be repeated multiple times. When the etching amount of the Co film is small, the steps S1 and S2 may be executed only once. In addition, the supply stop of the $O_2$ gas and the supply start of the Hfac gas and the $H_2$ gas may not occur at the same time. After the supply of the $O_2$ gas is stopped, the $O_2$ gas remaining in the processing chamber 11 may be purged by the $N_2$ gas, and then the Hfac gas and the $H_2$ gas may be supplied.

In the first and the second embodiment, as for the gas for etching Co, it is possible to use a β-diketone gas that can react with $CoO_x$ and generate a complex having a vapor pressure lower than $CoO_x$ as described in the above reaction formulas (1) to (3). For example, a gas such as trifluoro-acetylacetone (also referred to as 1,1,1-trifluoro-2,4-pentanedione), acetylacetone or the like can be used instead of a Hfac (also referred to as 1,1,1,5,5,5-hexafluoro-2,4-pentanedione) gas.

Evaluation Tests

Hereinafter, evaluation tests performed in relation to the disclosure will be described.

(Evaluation Test 1)

In an evaluation test 1-1, a Co film was etched by supplying gases to a plurality of wafers W, each having a Co film thereon, as described in the first embodiment. When the Hfac gas and the $O_2$ gas were supplied, temperatures of the wafers W were set to 250° C., 275° C. and 300° C. Upon completion of the etching process, film thicknesses of carbon films on the surfaces of the wafers W were measured.

As in the evaluation test 1-1, in an evaluation test 1-2, the etching process was performed while setting the temperatures of the wafers W to 250° C., 275° C. and 300° C. during the supply of the Hfac gas and the $O_2$ gas. Upon completion of the etching process, film thicknesses of carbon films on the surfaces of the wafers W were measured. In the evaluation test 1-2, another metal film, e.g., a Ni film, was formed instead of the Co film on the surface of the wafer W. The metal film was etched by the Hfac gas and the $O_2$ gas.

Figure 12:
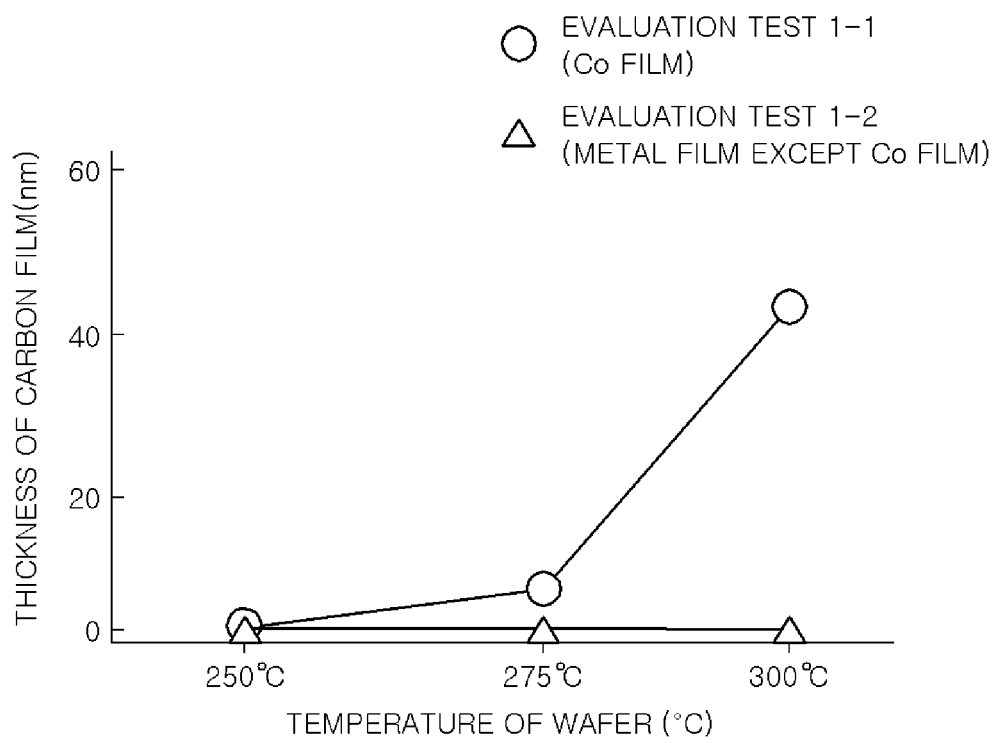
FIGS. 12 and 13 are graphs showing results of evaluation tests.

FIG. 12 is a graph showing a result of the evaluation tests 1-1 and 1-2. In the graph, the horizontal axis represents a temperature (unit: ° C.) of the wafer W during the supply of the $H_2$ gas and the $O_2$ gas and the vertical axis represents a film thickness (unit: nm) of the carbon film. In the evaluation test 1-2, the film thickness of the carbon film was 0 nm regardless of the wafer temperatures 250° C., 275° C. and 300° C. In other words, the formation of the carbon film was not confirmed. On the other hand, in the evaluation test 1-1, when the temperature of the wafer W was 250° C., the film thickness of the carbon film was 0 nm; when the temperature of the wafer W was 275° C., the film thickness of the carbon film was about 5 nm; and when the temperature of the wafer W was 300° C., the film thickness of the carbon film was about 50 nm. The film thicknesses of the carbon films formed in the evaluation test 1-1 had a comparatively large variation in the surface of the wafer W.

The present inventors have confirmed from the result of the evaluation tests 1-1 and 1-2 that the decomposition temperature of the Hfac gas in the case of etching the Co film is lower than the decomposition temperature of the Hfac gas in the case of etching a film made of a material other than Co due to the catalytic effect of Co and $CoO_x$. Further, the effect of the first embodiment has been proved from the fact that the carbon film was not formed when the temperature of the wafer W was 250° C. in the evaluation test 1-1.

Evaluation Test 2

In an evaluation test 2-1, a Co film formed on a surface of a wafer W was etched by simultaneously supplying Hfac gas and $O_2$ gas to the wafer W as in the first embodiment. In the evaluation test 2-1, a pressure in the processing chamber 11 during the supply of the Hfac gas and the $O_2$ gas was set to 20 Torr ($2.67 \times 10^3$ Pa). The etching process was performed on a plurality of wafers W while heating the wafers W to different temperatures. Upon completion of the etching process, etching rates (unit: nm/min) of Co films of the wafers W were measured. In an evaluation test 2-2, wafers W were processed substantially in the same manner as that in the evaluation test 2-1 and etching rates of Co films were measured. Unlike the evaluation test 2-1, in the evaluation test 2-2, a pressure in the processing chamber 11 during the supply of the Hfac gas and the $O_2$ gas was set to 100 Torr ($1.33 \times 10^4$ Pa).

Figure 13:
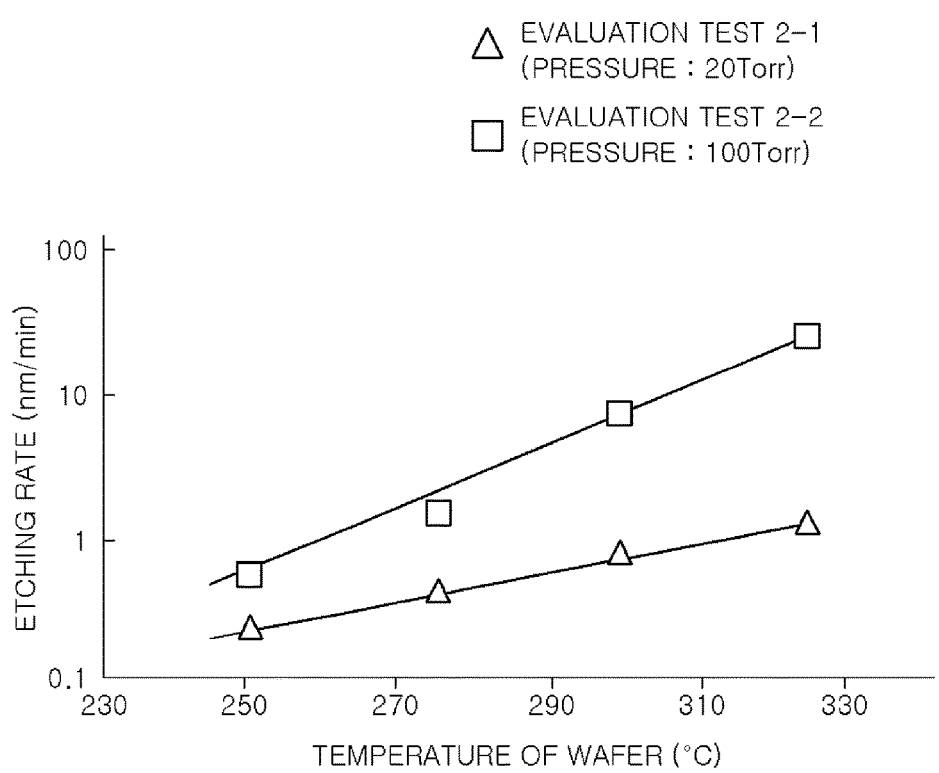

FIG. 13 is a semilogarithmic graph showing the results of the evaluation tests 2-1 and 2-2. In the graph, the horizontal axis represents a temperature (unit: ° C.) of the wafer W during the supply of the Hfac gas and the $O_2$ gas and the vertical axis represents an etching rate (unit: nm/min). As illustrated in the graph, in the evaluation tests 2-1 and 2-2, the etching rate was increased as the temperature of the wafer W was increased within a range from 250° C. to 330° C. This indicates that the etching rate depends on the temperature. When the temperature of the wafer W was the same in the evaluation tests 2-1 and 2-2, the etching rate was higher in the evaluation test 2-2. The activation energy for allowing the reaction that generates $Co(Hfac)_2$ in the reaction formula (2) to occur was obtained by the Arrhenius plot. As a result, when the pressure in the processing chamber 11 was 20 Torr, the activation energy was 1.39 eV and when the pressure in the processing chamber 11 was 100 Torr, the activation energy was 0.63 eV. This shows that the reaction in the reaction formula (2) easily occurs and the complex is easily generated in the evaluation test 2-2 than in the evaluation test 2-1.

As can be seen from the evaluation tests 2-1 and 2-2, the etching rate can be controlled by adjusting a pressure around the wafer W during the supply of the Hfac gas and the $O_2$ gas. Therefore, it is estimated that the wafer W can be etched at a practically sufficient speed even when the temperature of the wafer W is comparatively low. Further, the present inventors estimate from the test that the activation energy for allowing the reaction for generating a complex in the reaction formula (2) to occur is changed by controlling the flow rate ratio of the oxidizing gas to the etching gas.

(Evaluation Test 3)

In an evaluation test 3, a C 1 s spectrum of a surface of a Co film formed on a wafer W was obtained by an X-ray photoelectron spectroscopy (XPS). Further, the Co film on the surface of the wafer W was etched by simultaneously supplying Hfac gas and $O_2$ gas to the wafer W as in the first embodiment. A temperature of the wafer W during the supply of the gases was set to 300° C. different from that in the first embodiment. Upon completion of the etching process, the C 1 s spectrum of the surface of the wafer W was obtained by the XPS.

Figure 14:
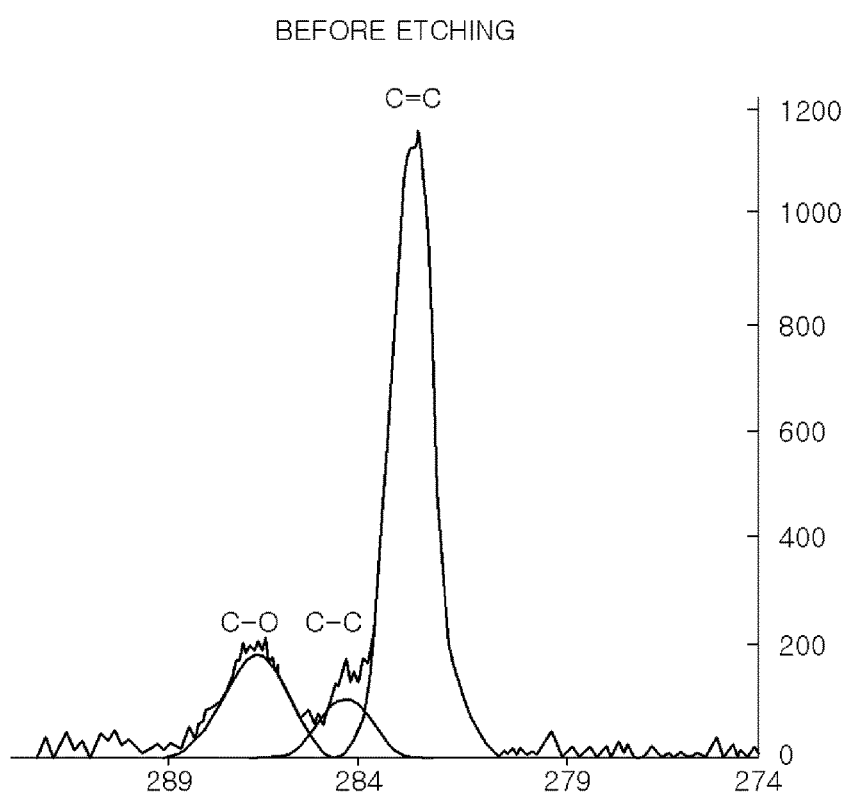
FIGS. 14 to 16 are spectrum diagrams showing results of evaluation tests.
Figure 15:
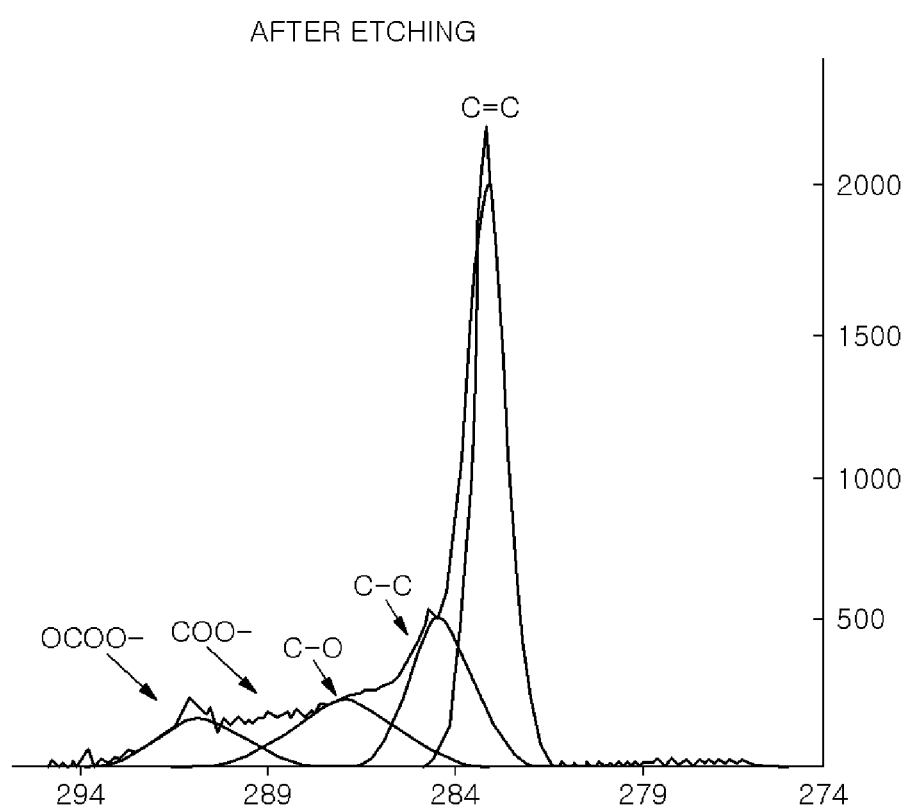

FIGS. 14 and 15 are graphs showing spectra obtained before and after the etching, respectively. In the graphs, a numerical value in the horizontal axis represents a binding energy (unit: eV) of an element and a numerical value in the vertical axis represents a detected intensity of a photoelectron. The spectra obtained before the etching shown in FIG. 14 show the existence of a double bond between carbon atoms, a single bond between carbon atoms and a single bond between a carbon atom and an oxygen atom. The spectra obtained after the etching show the existence of a group consisting of —COO— and —OCOO— in addition to the above-described bonds. Further, in the spectra obtained after the etching, a concentration of C atoms was 90% or above and Co was not detected. It is estimated from the spectra obtained by the XPS that the surface state of the wafer W is changed by the etching and that the carbon layer is formed on the surface of the wafer W.

A Raman spectroscopy was performed on the etched surface of the wafer W from which the spectra shown in FIG. 15 were obtained. As a result, spectra shown in FIG. 16 were obtained. In the spectra shown in FIG. 16, the horizontal axis represents a Raman shift (unit: $cm^{-1}$) and the vertical axis represents an intensity. In the spectra shown in FIG. 16, peaks expected to be derived from carbon were observed at a G band near 1600 $cm^{-1}$ and a D-band near 1340 $cm^{-1}$. The peak of the G-band shows the existence of crystal carbon and the peak of the D-band shows the existence of amorphous carbon. Therefore, a carbon layer in which the crystalline carbon is mixed with the amorphous carbon may be formed on the surface of the wafer W. The existence of the carbon layer was confirmed by the Raman spectroscopy.

Figure 16:
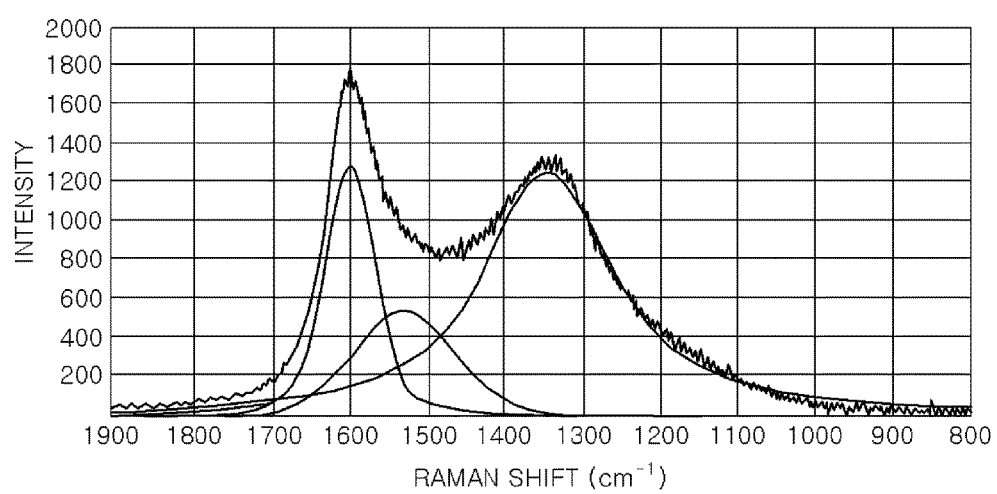
Figure 17:
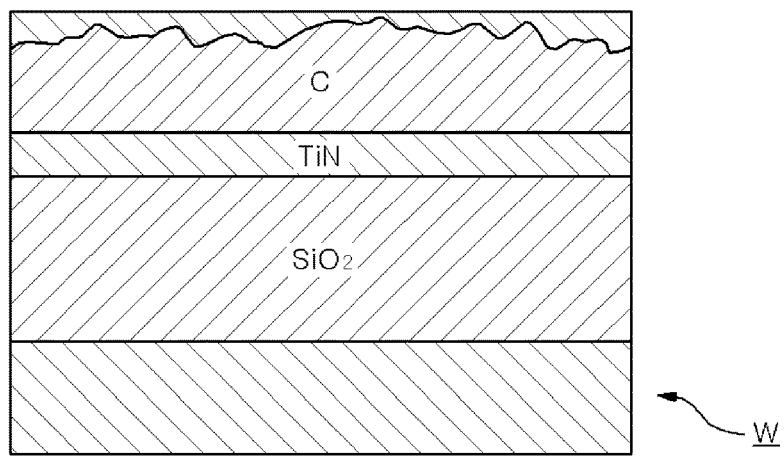
FIG. 17 is a schematic vertical cross sectional side view of a wafer which shows a result of an evaluation test.

An image of the etched wafer W from which the spectra shown in FIG. 16 were obtained was captured by a transmission type electron microscope (TEM). FIG. 17 is a schematic view of the captured image which shows a vertical cross section of the wafer W. An $SiO_2$ film, a TiN film and so on are laminated in that order from bottom to top. Before the etching, a Co film having a film thickness of 100 nm was formed on the TiN film. In this image, the Co film is completely removed and a carbon film having a film thickness of 70 nm is formed on the TiN film. From the evaluation test 2, it is clear that the carbon film (carbon layer) is formed by simultaneously supplying the Hfac gas and the $O_2$ gas to the wafer W while heating the wafer W to 300° C. Consequently, the present inventors have conceived the disclosure.

(Evaluation Test 4)

In an evaluation test 4, Co films formed on surfaces of a plurality of wafers W were etched by simultaneously supplying Hfac gas and $O_2$ gas to the surfaces of the Co films as in the first embodiment. However, temperatures of the wafers W during the supply of the gases were set to different levels. In an evaluation test 4-1, the wafer W was heated to a temperature ranging from 200° C. to 250° C. In an evaluation test 4-2, the wafer W was heated to 250° C. In an evaluation test 4-3, the wafer W was heated to 275° C. In an evaluation test 4-4, the wafer W was heated to 300° C. Upon completion of the etching process, spectra of the surfaces of the wafers W in the evaluation tests 4-1 to 4-4 were obtained by the XPS.

Figure 18:
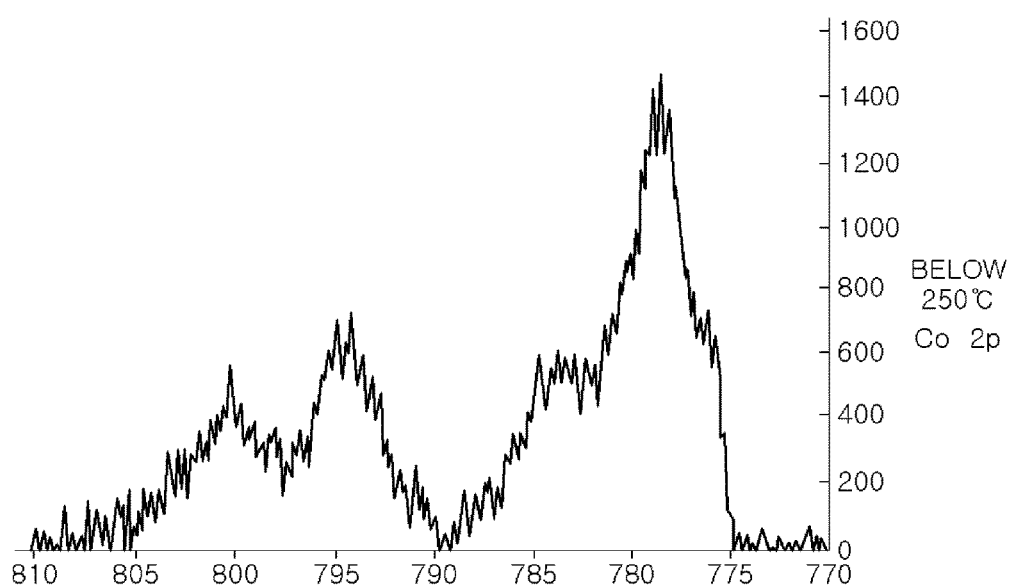
FIGS. 18 to 25 are spectrum diagrams showing results of evaluation tests.
Figure 19:
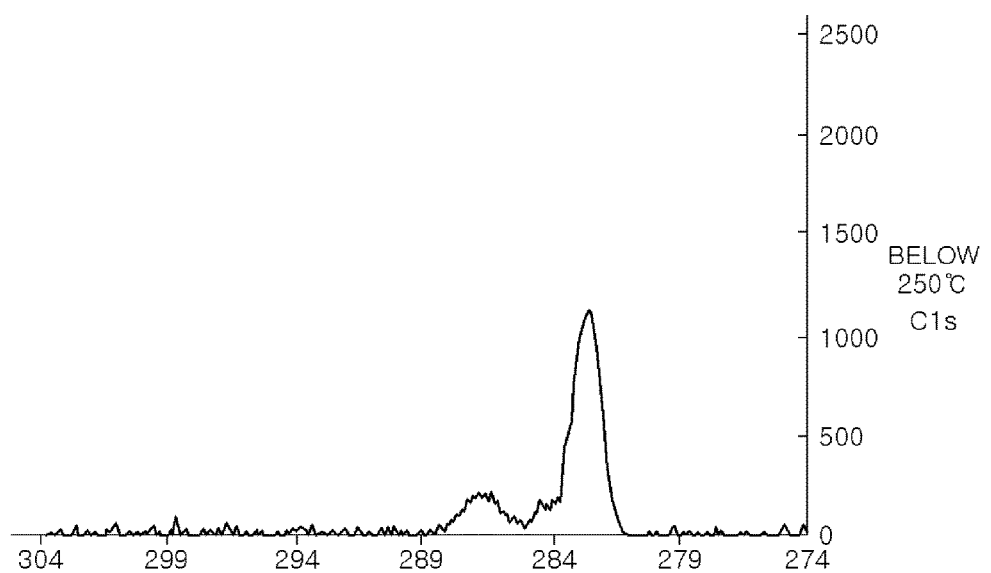
Figure 20:
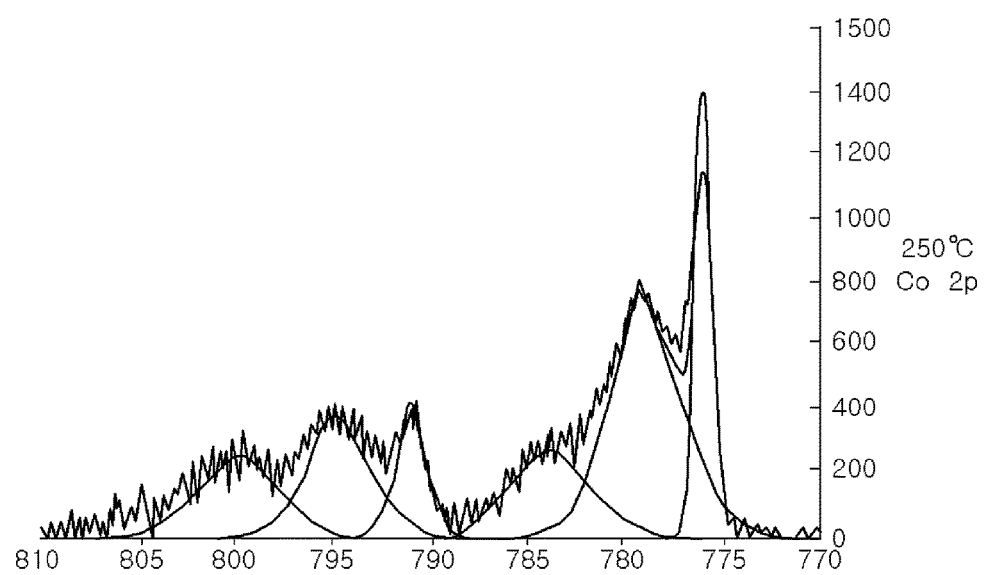
Figure 21:
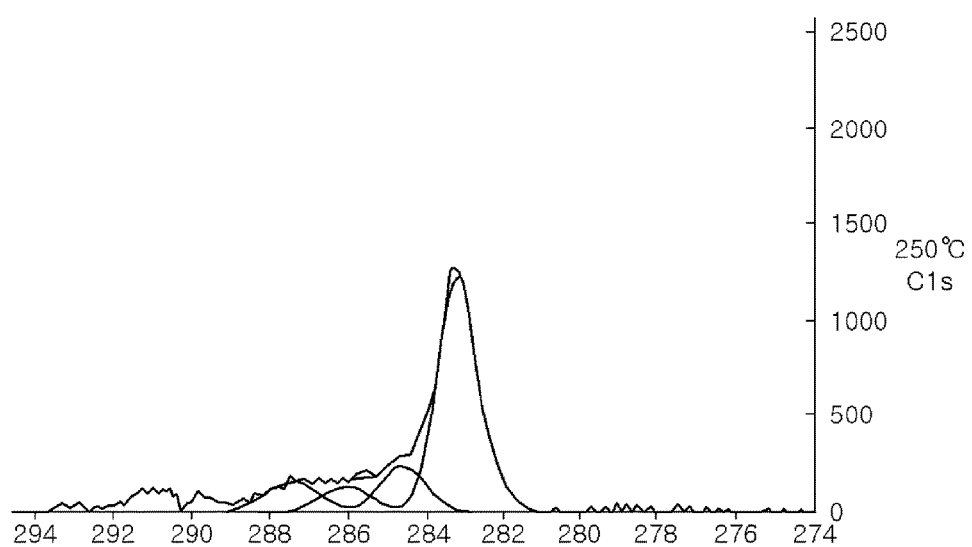
Figure 22:
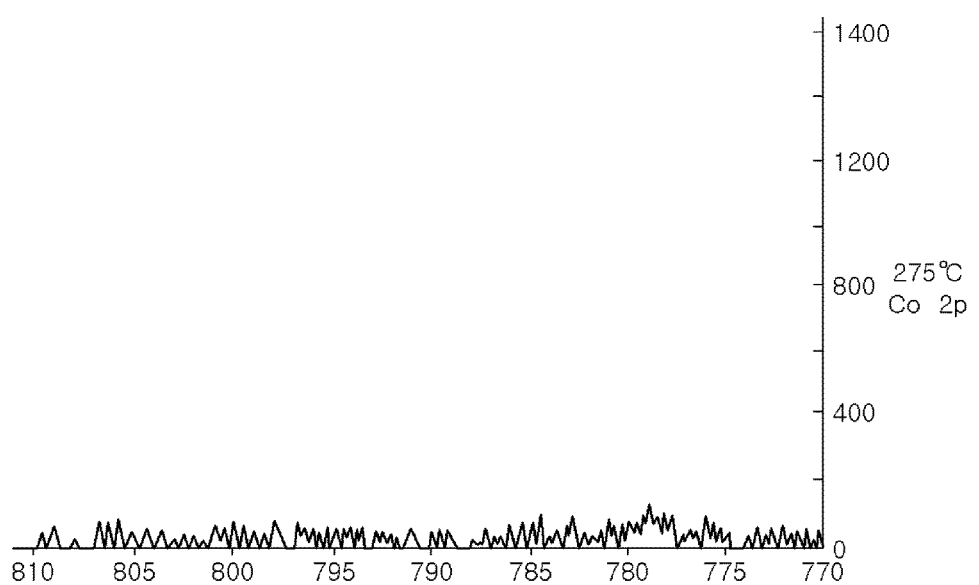
Figure 23:
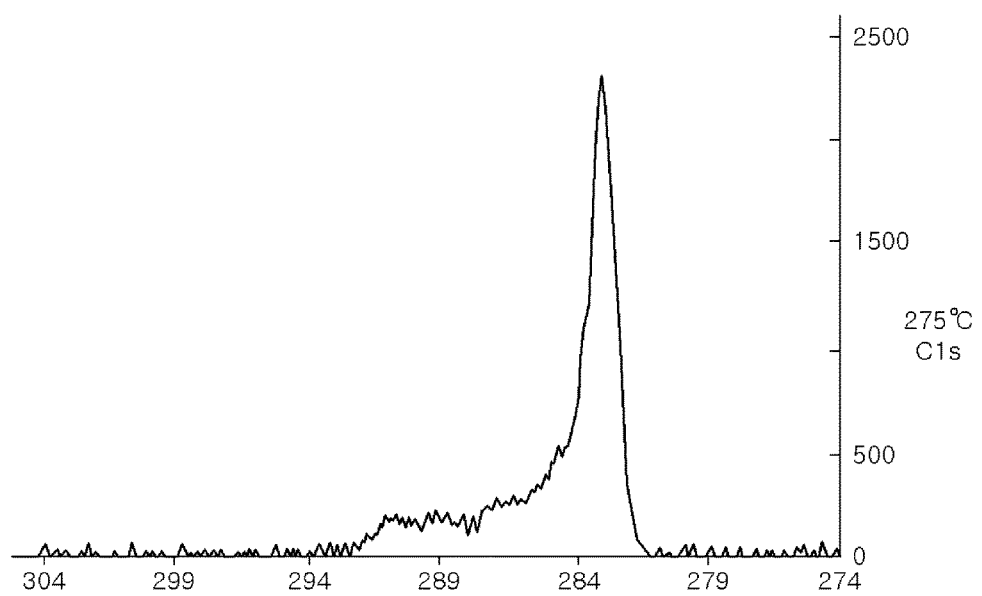
Figure 24:
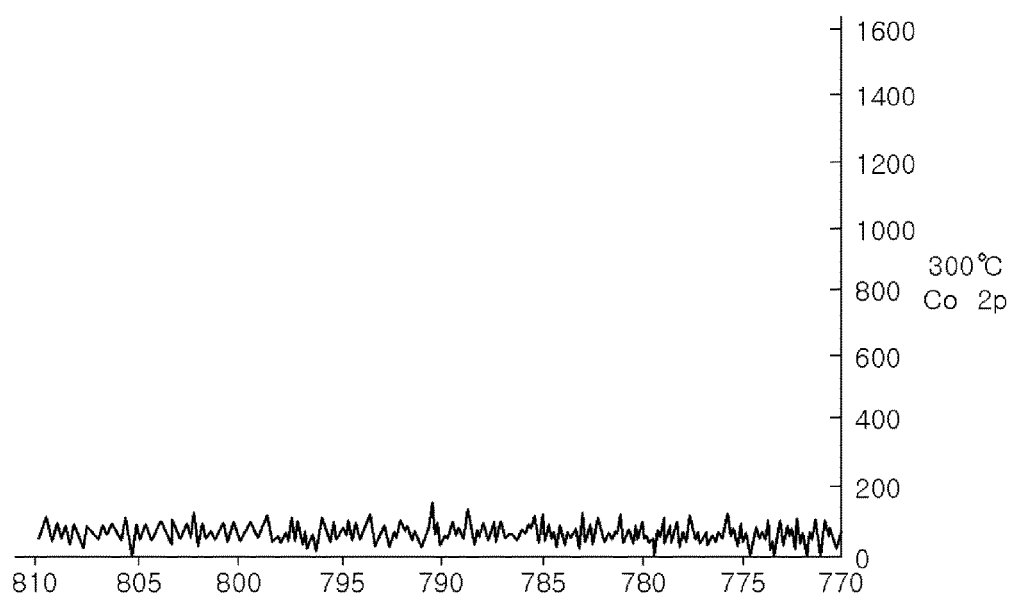
Figure 25:
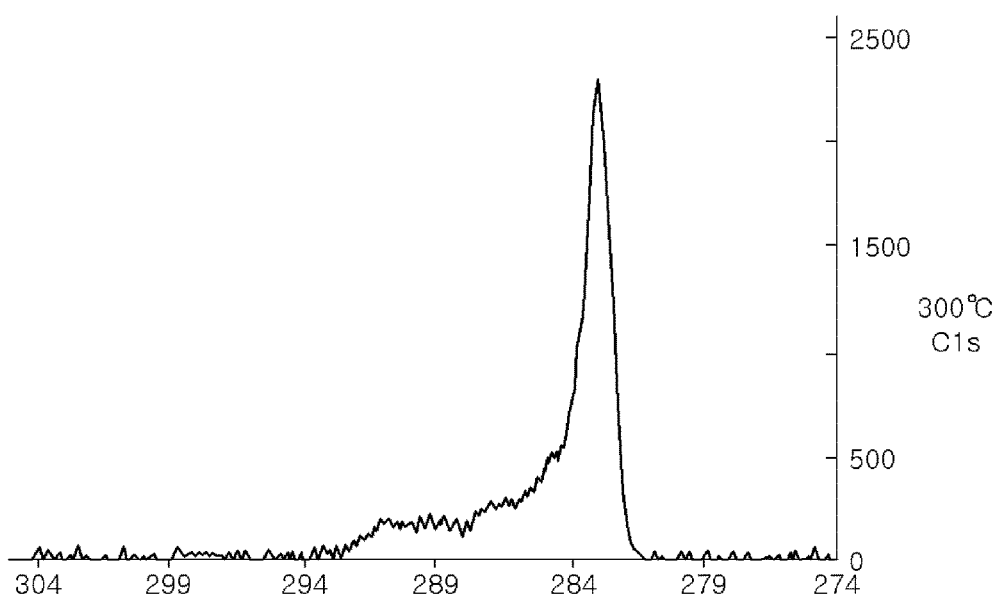

FIGS. 18 and 19, FIGS. 20 and 21, FIGS. 22 and 23, and FIGS. 24 and 25 are graphs showing spectra obtained in the evaluation tests 4-1, 4-2, 4-3 and 4-4, respectively. Similarly to FIGS. 14 and 15, the horizontal axis and the vertical axis in the graphs represent a binding energy (unit: eV) and a detected intensity of a photoelectron, respectively. FIGS. 18, 20, 22 and 24 show spectra from about 770 eV to 810 eV. FIGS. 19, 21, 23 and 25 show spectra from about 275 eV to about 295 eV. In FIGS. 18 and 20, Co 2p peaks are observed near 778 eV and 795 eV. In FIGS. 19 and 21, C 1 s peaks are observed near 285 eV. However, the corresponding peaks are low. In FIGS. 22 and 24, Co 2p peaks are not observed near 778 eV and 795 eV. In FIGS. 23 and 25, C 1 s peaks higher than those shown in FIGS. 19 and 21 are observed near 285 eV.

From the above result, it is estimated that the carbon film is not formed on the surface of the wafer W and the Co film is exposed in the evaluation tests 4-1 and 4-2 and also that the carbon film is formed to cover the Co film in the evaluation tests 4-3 and 4-4. In other words, it is clear that the carbon film is formed when the wafer W is heated to 275° C. or above during the simultaneous supply of the Hfac gas and the $O_2$ gas. Further, the effect of the first embodiment has been proved from the fact that the carbon film was not formed in the evaluation tests 4-1 and 4-2.

(Evaluation Test 5)

Figure 26:
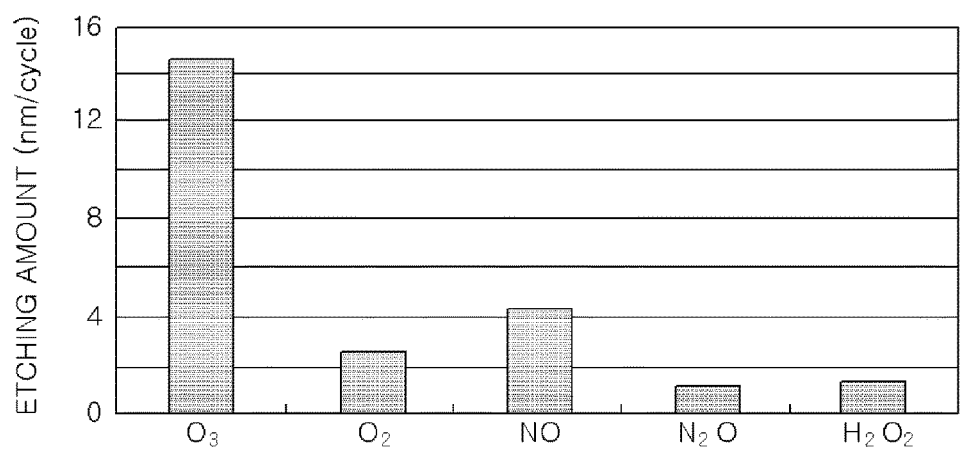
FIG. 26 is a graph showing a result of an evaluation test.

In an evaluation test 5, Co films of a plurality of wafers W were etched by the method of the first embodiment. However, in the etching process of the evaluation test 5, the wafers W were processed by different oxidizing gases for oxidizing Co. As for the oxidizing gas, there were used $O_3$ gas, $O_2$ gas, NO gas, $N_2O$ (nitrous oxide) gas and $H_2O_2$ (hydrogen peroxide) gas. FIG. 26 is a graph showing a result of the evaluation test 5. The vertical axis represents an etching amount (unit: nm/cycle) of Co per a single etching process during a predetermined period of time, i.e., an etching speed. The graph shows that the etching can be performed by using any of the above oxidizing gases. As can be clearly seen from the graph, the etching amount was greater in the case of using the $O_3$ gas and the NO gas than in the case of using the $O_2$ gas. Therefore, it is clear from the evaluation test 5 that it is particularly effective to use the $O_3$ gas or the NO gas as the oxidizing gas.

While the disclosure has been shown and described with respect to the embodiments, it will be understood by those skilled in the art that various changes and modifications may be made without departing from the scope of the disclosure as defined in the following claims.

What is claimed is:

1. An etching method comprising:
   supplying a target object with an oxidizing gas to oxidize a cobalt film formed on a surface of the target object; and
   etching the oxidized cobalt film by supplying an etching gas containing β-diketone and a decomposition suppressing gas for suppressing decomposition of the etching gas,
   wherein the decomposition suppressing gas is at least one gas selected from the group consisting of hydrogen gas, $NH_3$ gas, and $H_2S$ gas.

2. The etching method of claim 1, further comprising repeating a cycle including said supplying the target object with the oxidizing gas and said etching.

3. The etching method of claim 2, wherein said etching includes heating the target object to a temperature higher than or equal to 250° C. and lower than a decomposition temperature of the etching gas.

4. The etching method of claim 1, wherein said etching includes heating the target object to a temperature higher than or equal to 250° C. and lower than a decomposition temperature of the etching gas.

5. An etching method comprising:
   non-plasma etching a cobalt film formed on a surface of a target object by supplying nitrogen monoxide gas for oxidizing the cobalt film and an etching gas containing β-diketone to the target object such that a flow rate ratio of the nitrogen monoxide gas to the etching gas ranges from 0.5% to 50%,
   wherein the target object is heated during the etching to a temperature lower than or equal to 250° C., thereby preventing a formation of a carbon film by suppressing a decomposition of the etching gas.

6. An etching method comprising:
   supplying a target object with an oxidizing gas to oxidize a cobalt film formed on a surface of the target object; and
   etching the oxidized cobalt film by supplying a hydrogen containing gas and an etching gas containing β-diketone,
   wherein the hydrogen-containing gas is at least one gas selected from the group consisting of hydrogen gas, $NH_3$ gas, and $H_2S$ gas.

* * * * *